United States Patent
Dip et al.

(10) Patent No.: US 7,501,349 B2
(45) Date of Patent: Mar. 10, 2009

(54) SEQUENTIAL OXIDE REMOVAL USING FLUORINE AND HYDROGEN

(75) Inventors: Anthony Dip, Cedar Creek, TX (US); Allen John Leith, Austin, TX (US); Seungho Oh, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/393,736

(22) Filed: Mar. 31, 2006

(65) Prior Publication Data

US 2007/0238302 A1 Oct. 11, 2007

(51) Int. Cl.
*H01L 21/302* (2006.01)
(52) U.S. Cl. .................. 438/723; 438/706
(58) Field of Classification Search .......... 438/706, 438/710, 714, 723, 724, 725, 745, 756
See application file for complete search history.

(56) References Cited

U.S. PATENT DOCUMENTS

| 6,083,413 | A * | 7/2000 | Sawin et al. ............ 216/104 |
| 6,194,327 | B1 * | 2/2001 | Gonzalez et al. ........ 438/770 |
| 6,667,489 | B2 | 12/2003 | Suzumura et al. |
| 2002/0119653 | A1 * | 8/2002 | Yamane ................... 438/637 |
| 2003/0064590 | A1 | 4/2003 | Hwang |
| 2003/0109095 | A1 | 6/2003 | Boydston et al. |
| 2004/0097047 | A1 * | 5/2004 | Natzle et al. ............ 438/300 |
| 2004/0251235 | A1 * | 12/2004 | Shinriki et al. .......... 216/58 |
| 2004/0266214 | A1 * | 12/2004 | Suguro et al. ........... 438/771 |
| 2005/0048742 | A1 * | 3/2005 | Dip et al. ............... 438/476 |
| 2005/0164445 | A1 | 7/2005 | Lin et al. |
| 2005/0275024 | A1 | 12/2005 | Yeo et al. |

* cited by examiner

*Primary Examiner*—Kin-Chan Chen
(74) *Attorney, Agent, or Firm*—Oblon, Spivak, McClelland, Maier & Neustadt, P.C.

(57) ABSTRACT

A method is provided for oxide removal from a substrate. The method includes providing the substrate in a process chamber where the substrate has an oxide layer formed thereon, and performing a sequential oxide removal process. The sequential oxide removal process includes exposing the substrate at a first substrate temperature to a flow of a first etching gas containing $F_2$ to partially remove the oxide layer from the substrate, raising the temperature of the substrate from the first substrate temperature to a second substrate temperature, and exposing the substrate at the second temperature to a flow of a second etching gas containing $H_2$ to further remove the oxide layer from the substrate. In one embodiment, a film may be formed on the substrate following the sequential oxide removal process.

24 Claims, 5 Drawing Sheets

SEQUENTIAL OXIDE REMOVAL USING FLUORINE AND HYDROGEN

CROSS REFERENCE TO RELATED APPLICATIONS

The present invention is related to U.S. patent application Ser. No. 11/206,056, titled "LOW-TEMPERATURE OXIDE REMOVAL USING FLUORINE," the entire contents of which is hereby incorporated by reference.

FIELD OF THE INVENTION

The present invention relates to semiconductor processing, and more particularly, to a low-temperature process for oxide removal from a substrate and subsequent formation of a film on the substrate.

BACKGROUND OF THE INVENTION

Silicon (Si)-containing films are used for a wide variety of applications in the semiconductor industry. Si-containing films include films such as epitaxial Si, polycrystalline Si (poly-Si), amorphous Si, epitaxial silicon germanium (SiGe), silicon germanium carbide (SiGeC), silicon carbide (SiC), silicon nitride (SiN), silicon carbonitride (SiCN), and silicon carboxide (SiCO). As circuit geometries shrink to ever smaller feature sizes, lower processing temperatures are preferred, for example because of introduction of new materials into semiconductor devices and/or reduction of thermal budgets for shallow implants in source and drain regions. Moreover, it is evident that non-selective (blanket) and selective deposition of Si-containing films will be needed for future devices.

Epitaxial Si deposition is a process where the crystal lattice of the bulk Si is extended through growth of a new Si-containing film that may have a different doping level than the bulk. Matching target eptaxial film thickness and resistivity parameters is important for the subsequent fabrication of properly functioning devices. Prior to depositing a Si-containing film, e.g., epitaxial Si or epitaxial SiGe films, on a Si substrate, it may be required to remove a native oxide layer from the surface of the substrate in order to prepare a proper starting growth surface (i.e., a seed layer) to deposit a high quality epitaxial film on. A native oxide layer, which may be a few to several angstrom (1 Å=$1\times10^{-10}$ m) thick, for example, forms easily on clean Si surfaces when exposed to an oxygen-containing environment (e.g., air), even at room temperature and atmospheric pressure. If the substrate is not cleaned prior to depositing a Si-containing film on the substrate, i.e., all oxygen and other contaminants have not been properly removed from the substrate surface, then the Si-containing film subsequently deposited on the substrate may not grow epitaxially and may contain defects that can lead to a high leakage current through the film and cause the microelectronic device to not perform optimally.

Similarly, a poly-Si film can be deposited directly on a poly-Si film to form an electrical contact. However, because other processing typically occurs between the poly-Si deposition steps, the substrates (wafers) can be removed from the processing system between the deposition steps, in which case a native oxide layer can form on the substrates. If the native oxide layer is not removed prior to depositing the poly-Si film, the resulting contact can have high electrical resistance and/or other undesirable properties.

It may also be necessary to remove a native oxide layer from a substrate, for example, prior to depositing a high dielectric constant (high-k) film on the substrate, where the high-k film is a part of a gate stack. Examples of high-k films include $HfO_2$, $HfSiO_x$, $HfSiO_xN_y$, $ZrO_2$, $ZrSiO_x$, and $ZrSiO_xN_y$. The presence of an oxide layer can reduce the effective dielectric constant of the gate stack since the oxide layer normally has a lower dielectric constant than the high-k film. Thus, a higher dielectric constant and higher level of control over the overall dielectric constant can be achieved if the oxide layer is effectively removed before depositing a high-k film.

Traditionally, high-temperature annealing at or above 900° C. in a hydrogen atmosphere has been used in (vertical) batch processing systems to remove a native oxide layer from substrates and clean the substrates of other impurities prior to a deposition process. However, such a high-temperature process does not meet current or future thermal budget needs for many advanced processes, which can prevent their integration into device manufacturing process flows. For example, current gate lengths and modern microelectronic structures limit devices to a reduced thermal budget.

Plasma processing has been found to allow lowering of the substrate temperature during processing and thus offers an alternative to high-temperature annealing in a hydrogen atmosphere. However, exposure of the substrate to a plasma source can damage the substrate as a result of the interaction of excited species in the plasma with the substrate. Another oxide removal method is based on hydrogen fluoride (HF), but the use of HF can result in incomplete oxide removal and unwanted erosion of the substrate and various films on the substrate.

SUMMARY OF THE INVENTION

Embodiments of the invention address the above-described problems associated with removing an oxide layer from a substrate. Embodiments of the invention provide a method for effective removal of an oxide layer from a substrate at a relatively low substrate temperature while minimizing damage to the substrate. The low substrate temperature provides the flexibility needed for integrating the oxide removal process into device manufacturing schemes. According to an embodiment of the invention, a method is provided for removing an oxide layer from a substrate at low substrate temperature and subsequently depositing a low defect film on the substrate.

According to an embodiment of the invention, the method includes providing a substrate in a process chamber of a processing system, where the substrate has an oxide layer formed thereon, and performing a sequential oxide removal process. The sequential oxide removal process includes exposing the substrate to a first etching gas containing $F_2$ at a first substrate temperature to partially remove the oxide layer from the substrate. Thereafter, the substrate is heated from the first substrate temperature to a second substrate temperature, and the substrate is exposed to a second process gas containing $H_2$ to further remove the oxide layer from the substrate.

According to an embodiment of the invention, the substrate can contain Si, SiGe, Ge, a glass substrate, a LCD substrate, or a compound semiconductor substrate. The deposited film can be a Si-containing film, such as Si or SiGe, Ge, or a high-k dielectric film, such as $Ta_2O_5$, $TiO_2$, $Al_2O_3$, $Y_2O_3$, $HfSiO_x$, $HfO_2$, $HfSiO_xN_y$, $ZrO_2$, $ZrSiO_x$, $TaSiO_x$, $ZrSiO_xN_y$, $SrO_x$, $SrSiO_x$, $LaO_x$, $LaSiO_x$, $YO_x$, or $YSiO_x$. According to an embodiment of the invention the Si substrate and the Si film can be epitaxial Si. According to another embodiment of the invention, the Si substrate and the Si film can be poly-Si.

According to an embodiment of the invention, the method includes providing a Si substrate in a process chamber of a processing system, the Si substrate having an oxide layer formed thereon, and performing a sequential oxide removal process. The sequential oxide removal process includes exposing the Si substrate to an etching gas containing $F_2$ at a first substrate temperature between about 20° C. and about 400° C. to partially remove the oxide layer from the Si substrate. Thereafter, the substrate is heated from the first substrate temperature to a second substrate temperature lower than 900° C., and the substrate is exposed to a second etching gas containing $H_2$ to further remove the oxide layer from the substrate.

BRIEF DESCRIPTION OF THE DRAWINGS

The features, advantages and technical and industrial significance of embodiments of the present invention will be better understood by reading the following detailed description of the preferred embodiments when considered in connection with the accompanying drawings, in which.

DETAILED DESCRIPTION OF SEVERAL EMBODIMENTS

Figure 1:
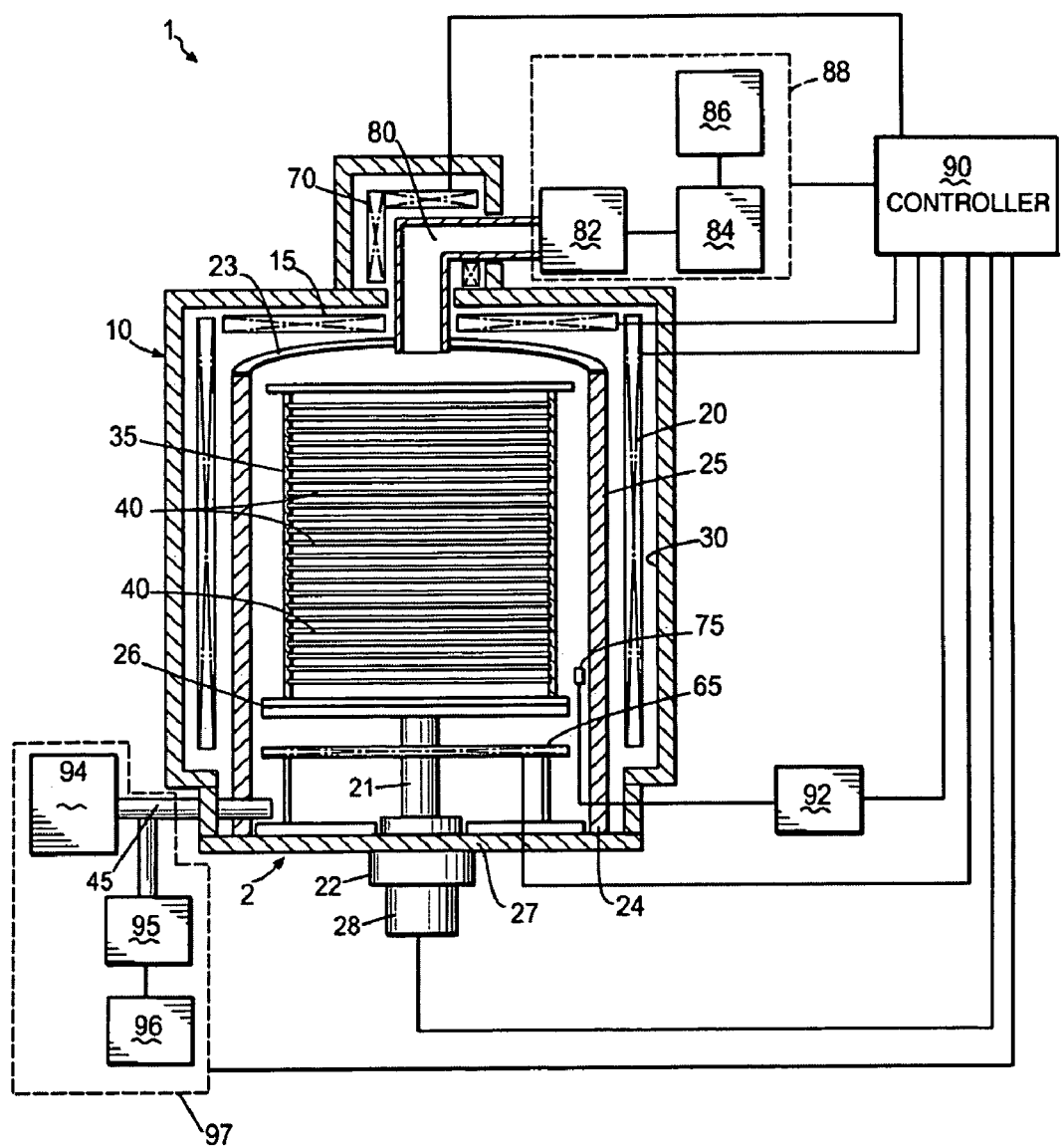
FIG. 1 illustrates a simplified block diagram of a batch processing system configured for processing a substrate according to an embodiment of the invention.

Embodiments of the invention may be used for native oxide removal (NOR) from a substrate prior to depositing a film onto the substrate. For example, the native oxide removal can be carried out prior to forming an epitaxial Si film, a poly-Si film, or a high-k film on a Si substrate. Embodiments of the invention may also be used to remove types of oxides other than native oxides, such as thin chemical oxides film grown or deposited on substrates, for example.

In the following description, the terms native oxide layer and oxide layer are used interchangeably to refer to any oxide layer to be removed from a substrate prior to further processing such as forming a film on the substrate. For a Si substrate, an oxide layer or a native oxide layer can, for example, be a $SiO_2$ layer or a $SiO_x$ (x<2) layer.

As noted above, traditional high-temperature hydrogen anneals at or above 900° C. to remove an oxide layer and other impurities from a substrate prior to further processing do not meet current or future thermal budget needs for certain processes. Furthermore, these hydrogen anneals can require long exposure times at very high substrate temperatures, for example as long as 60 minutes (min) at 900° C., to adequately remove the oxide layer from the substrate. Low temperature processes for removing an oxide layer and which are compatible with advanced device processes requiring a low thermal budget and shorter processing times are needed.

Based on this recognition, the present inventors studied the use of a $F_2$-containing gas in a low-temperature oxide removal process. Fluorine containing gases are known to have aggressive etch characteristics that were thought to be suitable only for aggressive etch processes. For example, $NF_3$ and $ClF_3$ have been used in chamber cleaning processes wherein deposited materials are removed from interior surfaces of the chamber. Further, U.S. Pat. No. 6,194,327 discloses use of a fluorine gas for rapid thermal etching of thick sacrificial oxide layers. However, this process is performed at temperatures of 800-1200° C. which, as with the hydrogen annealing discussed above, is too high for some current and future thermal budget requirements. Moreover, the present inventors recognized that high-temperature fluorine etching is too aggressive, and can result in etching of the underlying substrate and forming a rough substrate surface unsuitable for subsequent film deposition. In addition, high temperature fluorine etching may aggressively etch process chamber components such as a process tube and a substrate holder.

In studying the use of a $F_2$-containing gas for etching thin oxide layers, the present inventors discovered in co-pending U.S. patent application Ser. No. 11/206,056 that a $F_2$-containing gas applied at substrate temperature of about 400° C., or lower, can provide acceptable etching characteristics for thin native oxides that can be a few angstrom in thickness, for example as thin as 2-3 angstrom following a $H_2O$:HF wet clean. One reason for the upper temperature limit is that the underlying Si substrate becomes rough if the substrate temperature is too high, even at about 300° C. However, roughening effects at this temperature may be acceptable for some applications. This effect is (in part) due to faster etching rate of the underlying Si substrate compared to the overlying native oxide layer. This faster etching of Si versus oxide has been observed when etching oxide layers formed on a Si substrate in a deposition process from TEOS gas. At 200° C. the (poly) Si etch rates were about 2.5 angstrom/min and the oxide etch rates were about 0.07 angstrom/min. At 300° C. the (poly). Si etch rates were about 8 angstrom/min and the oxide etch rates were about 0.1 angstrom/min.

As described above, high-temperature hydrogen anneals and low-temperature $F_2$ etching each have drawbacks when used to remove oxide layers from substrates, i.e., the hydrogen anneals utilize high substrate temperatures and $F_2$ gas can etch Si and SiN faster than oxide layer which can roughen and even destroy the exposed structures. In addition, it has been observed that $F_2$ gas may not be able to completely remove the oxide layer and F-containing impurities are often left on the substrate surface following the $F_2$ exposure.

Embodiments of the current invention utilize $F_2$ etching and a hydrogen anneal in a sequential oxide removal process to reduce or eliminate the above-mentioned problems. According to one embodiment of the invention, a substrate containing an oxide layer thereon is exposed at a first substrate temperature to a flow of a first etching gas containing $F_2$ to partially remove the oxide layer from the substrate. Thereafter, the flow of the first etching gas is stopped and the temperature of the substrate is raised from the first substrate temperature to a second substrate temperature. Next, the substrate is exposed at the second temperature to a flow of a second etching gas containing $H_2$ to further remove the oxide layer from the substrate.

The first etching gas containing $F_2$ partially removes the oxide layer in a low temperature process and enables complete removal of the remaining oxide layer and any F-containing impurities on the substrate in a subsequent hydrogen anneal at a substrate temperature below 900° C. It is contemplated that, in addition to partially removing the oxide layer, the first etching gas roughens or modifies the oxide layer, thereby facilitating further removal of the oxide layer by the second etching gas at a substrate temperature below 900° C. In one embodiment, the hydrogen anneal can be done at conventional temperatures above 900° C., for example 900° C.-1100° C., but for a shortened time period less than 15 min., more preferably less than 5 min., for example. That is, where thermal budget is determined as an integral of temperature and time, thermal budget savings from the low temperature $F_2$ process may be used in the $H_2$ process by a brief $H_2$ process at conventional $H_2$ anneal temperatures, or a longer $H_2$ process at lower temperatures. As would be understood by one of ordinary skill in the art, the temperature and time of the $H_2$ process will vary based on overall thermal budget and/or temperature limits of materials being processed. The two step etch process of the current invention may also reduce the total exposure time needed compared to the exposure time needed when only one of the two etch processes is used to remove an oxide layer. In one example, an oxide layer can be fully removed by exposing the substrate at a substrate temperature between about 200° C. and about 300° C. to a first etching gas containing $F_2$ for 15-30 min, followed by exposing the substrate at a second substrate temperature between about 800° C. and about 850° C. to a second etching gas containing $H_2$ for 15 min. For comparison, a 60 min hydrogen anneal at a substrate temperature of 900° C. may be required to fully remove the same oxide layer in the absence of a prior low temperature exposure to a first etching gas containing $F_2$. Thus, the two step process described in embodiments of the invention can reduce drawbacks of each of the individual etch steps.

Embodiments of the invention further provide formation of a film on the substrate following the two step removal of the oxide layer. In one embodiment, the film is formed on the substrate at a third substrate temperature greater than the first substrate temperature but lower than the second substrate temperature to achieve deposition rates that are high enough for device manufacturing and to ensure that the deposited film has the desired material properties. The desired material properties can, for example, include a crystal structure (i.e., epitaxial, polycrystalline, or amorphous), and elemental composition. Furthermore, the third substrate temperature can be selected to provide selective film deposition on exposed Si-containing surfaces of the substrate, or non-selective (blanket) film deposition on the whole substrate. In order to prevent formation of a new oxide layer on the substrate, the Si-containing film can be formed on the substrate following the oxide removal step without exposing the substrate to ambient air or other oxygen-containing ambients. According to one embodiment of the invention, the oxide removal steps and the subsequent formation of a film on the clean substrate may be performed in the same processing system or in a single processing tool containing a plurality of processing systems. These two approaches avoid exposure of the cleaned substrate to air prior to film formation, thereby forming a high quality substrate/film interface without formation of a new oxide layer.

In order to facilitate a thorough understanding of the invention and for purposes of explanation, specific details are set forth, such as a particular geometry of the batch processing system and descriptions of various components. However, it should be understood that the invention may be practiced in other embodiments that depart from these specific details which are not limiting in any way.

FIG. 1 illustrates a simplified block diagram of a batch processing system configured for processing a substrate according to an embodiment of the invention. The batch processing system 1 contains a process chamber 10 and a process tube 25 that has an upper end 23 connected to an exhaust pipe 80, and a lower end 24 hermetically joined to a lid 27 of cylindrical manifold 2. The exhaust pipe 80 discharges gases from the process tube 25 to a vacuum pumping system 88 to maintain a pre-determined atmospheric or below atmospheric pressure in the processing system 1. A substrate holder 35 for holding a plurality of substrates (wafers) 40 in a tier-like manner (in respective horizontal planes at vertical intervals) is placed in the process tube 25. The substrate holder 35 resides on a turntable 26 that is mounted on a rotating shaft 21 penetrating the lid 27 and driven by a motor 28. The turntable 26 can be rotated during processing to improve overall oxide etch uniformity and/or deposited film uniformity or, alternately, the turntable can be stationary during processing. The lid 27 is mounted on an elevator 22 for transferring the substrate holder 35 in and out of the process tube 25. When the lid 27 is positioned at its uppermost position, the lid 27 is configured to close the open end of the manifold 2.

A gas delivery system 97 is configured to introduce gases into the process chamber 10. A plurality of gas supply lines can be arranged around the manifold 2 to supply a plurality of gases into the process tube 25 through the gas supply lines. For simplicity, only one gas supply line 45 among the plurality of gas supply lines is shown in FIG. 1. The gas supply line 45 is connected to a first gas source 94. In general, the first gas source 94 can supply gases for processing the substrates 40, including a first etching gas containing $F_2$, a second etching gas containing $H_2$, and gases for forming films (e.g., Si-containing gases for depositing Si-containing films) onto the substrates 40.

Alternatively, or in addition, one or more of the gases can be supplied from the (remote) plasma source 95 that is operatively coupled to a second gas source 96 and to the process chamber 10 by the gas supply line 45. The plasma-excited gas is introduced into the process tube 25 by the gas supply line 45. The plasma source 95 can, for example, be a microwave plasma source, a radio frequency (RF) plasma source, or a plasma source powered by light radiation. In the case of a microwave plasma source, the microwave power can be between about 500 Watts (W) and about 5,000 W. Examples of microwave frequencies that could be used are 2.45 GHz or 8.3 GHz. In one example, the remote plasma source can be a Downstream Plasma Source Type AX7610, manufactured by MKS Instruments, Wilmington, Mass., USA.

A cylindrical heat reflector 30 is disposed so as to cover the reaction tube 25. The heat reflector 30 has a mirror-finished inner surface to suppress dissipation of radiation heat radiated by a main heater 20, a bottom heater 65, a top heater 15, and an exhaust pipe heater 70. A helical cooling water passage (not shown) is formed in the wall of the process chamber 10 as a cooling medium passage. The heaters 20, 65, and 15 can, for example, maintain the temperature of the substrates 40 between about 20° C. and about 900° C.

The vacuum pumping system 88 comprises a vacuum pump 86, a trap 84, and an automatic pressure controller (APC) 82. The vacuum pump 86 can, for example, include a dry vacuum pump capable of a pumping speed up to 20,000 liters per second (and greater). During processing, gases can be introduced into the process chamber 10 via the gas supply line 45 of the gas delivery system 97 and the process pressure can be adjusted by the APC 82. The trap 84 can collect unreacted process materials and by-products from the process chamber 10.

The process monitoring system 92 comprises a sensor 75 capable of real-time process monitoring and can, for example, include a mass spectrometer (MS), a Fourier Transform Infrared (FTIR) spectrometer, or a particle counter. A controller 90 includes a microprocessor, a memory, and a digital I/O port capable of generating control voltages sufficient to communicate and activate inputs to the processing system 1 as well as monitor outputs from the processing system 1. Moreover, the controller 90 is coupled to, and can exchange information with, gas delivery system 97, motor 28, process monitoring system 92, heaters 20, 15, 65, and 70, and vacuum pumping system 88. The controller 90 may be implemented as a DELL PRECISION WORKSTATION 610™. The controller 90 may also be implemented as a general purpose computer, processor, digital signal processor, etc., which causes a substrate processing apparatus to perform a portion or all of the processing steps of the invention in response to the controller 90 executing one or more sequences of one or more instructions stored in a computer readable medium. The computer readable medium or memory is configured to hold instructions programmed according to the teachings of the invention and to store data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

The controller 90 may be locally located relative to the processing system 1, or it may be remotely located relative to the processing system 1 via the internet or an intranet. Thus, the controller 90 can exchange data with the processing system 1 using at least one of a direct connection, an intranet, and the internet. The controller 90 may be coupled to an intranet at a customer site (i.e., a device maker, etc.), or coupled to an intranet at a vendor site (i.e., an equipment manufacturer). Furthermore, another computer (i.e., controller, server, etc.) can access controller 90 to exchange data via at least one of a direct connection, an intranet, and the internet.

It is to be understood that the batch processing system 1 depicted in FIG. 1 is shown for exemplary purposes only, as many variations of the specific hardware can be used to practice the present invention, and these variations will be readily apparent to one having:ordinary skill in the art. The processing system 1 in FIG. 1 can, for example, process substrates of any size, such as 200 mm substrates, 300 mm substrates, or even larger substrates. Furthermore, the processing system 1 can simultaneously process from one substrate up to about 200 substrates, or more. Alternatively, the processing system can simultaneously process up to about 25 substrates. The substrate can, for example, be a semiconductor substrate, such as a Si substrate, a SiGe substrate, a Ge substrate, a glass substrate, a LCD substrate, or a compound semiconductor substrate, and can include numerous active devices and/or isolation regions. Furthermore, the substrate can contain vias or trenches or combinations thereof.

Figure 2A:
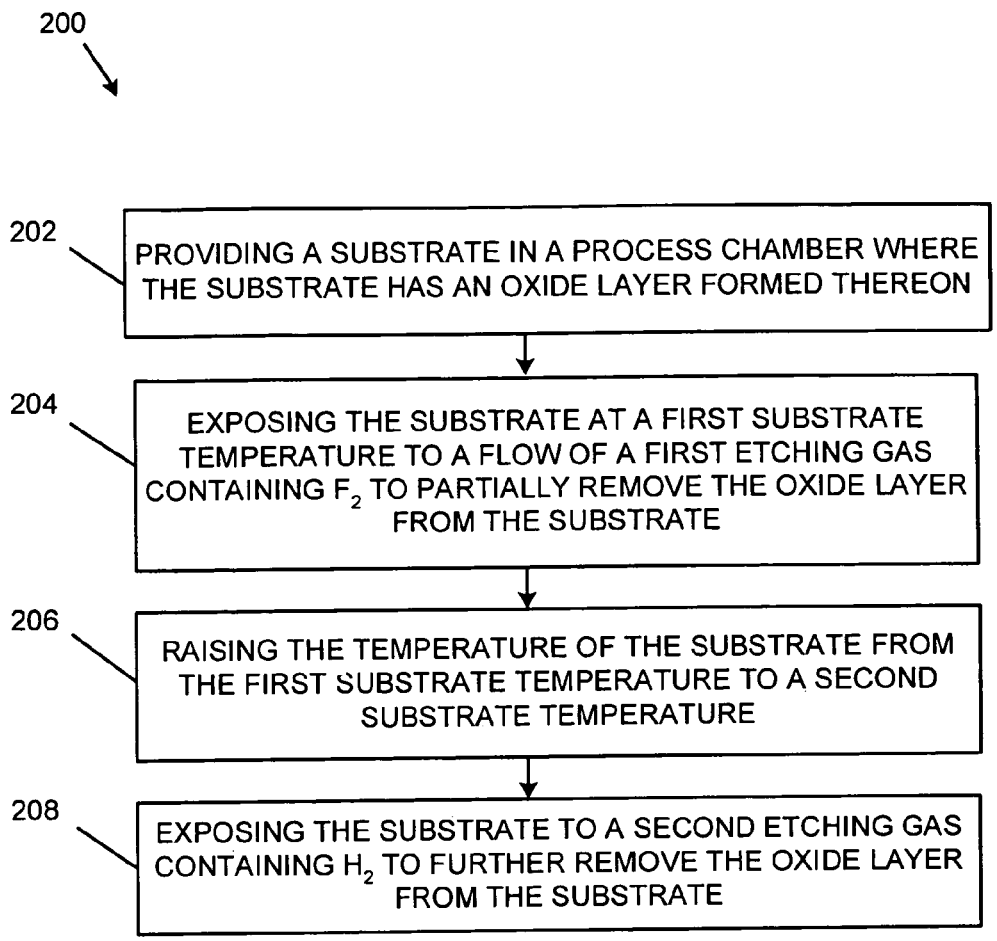
FIG. 2A illustrates a flow diagram for oxide removal from a substrate according to an embodiment of the invention.
Figure 2B:
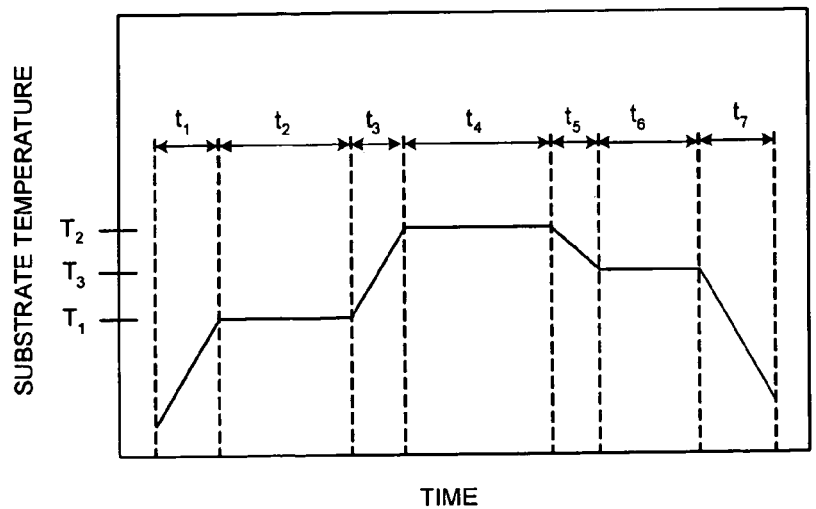
FIG. 2B illustrates the variation in substrate temperature as a function of processing time for oxide removal from a substrate and subsequent deposition of a film onto the substrate according to an embodiment of the invention.

Reference will now be made to FIGS. 2A and 2B. FIG. 2A illustrates a flow diagram for oxide removal from a substrate in a process chamber according to an embodiment of the invention. FIG. 2B illustrates the variation in substrate temperature as a function of processing time for oxide removal from a substrate and subsequent deposition of a film onto the substrate according to an embodiment of the invention. In FIG. 2A, the process 200 includes, in step 202, providing a substrate in a process chamber of a processing system where the substrate has an oxide layer formed thereon. The processing system can, for example, be the batch processing system 1 depicted in FIG. 1 capable of processing at least one substrate simultaneously. Alternatively, the processing system can be a single wafer processing system. According to an embodiment of the invention, the oxide layer can be a native oxide layer that is 1-3 angstrom thick and is formed by exposing the substrate to air following $H_2O$:HF wet cleaning. Alternately, the oxide layer can be thicker than 1-3 angstrom, for example up to about 10 angstrom, or even thicker. In one example, the presence of the oxide layer on the substrate can, if not removed, inhibit formation of a proper Si-containing seed (nucleation) film and thereby affect deposition of a Si-containing film on the substrate.

After providing the substrate in the process chamber in step 202, the substrate is heated to a first substrate temperature $T_1$ during time period $t_1$ as shown in FIG. 2B. In one embodiment, $T_1$ can be about 400° C., or lower, to reduce process damage, such as etch damage to the substrate or to other materials on the substrate. The time period $t_1$ is a transition step and can, for example, be between about 2 min and about 15 min, but this is not required in embodiments of the invention.

In step 204, during time period $t_2$, the substrate is exposed to a flow of a first etching gas containing $F_2$ gas at the first substrate temperature $T_1$ to partially remove the oxide layer from the substrate, thereby leaving an oxide layer with a reduced thickness on the substrate. The first substrate temperature $T_1$ can be selected in consideration of efficient removal of the oxide layer from the substrate while minimizing damage such as etching of the substrate material or other materials formed on the substrate material from $F_2$ in the first etching gas. For example, where substrate etching is of little concern, then $T_1$ may include or approach 400° C. However, when substrate damage is a concern, the substrate temperature $T_1$ can be much lower, although the etch rate may also be lowered. Exemplary run times for the $F_2$ native oxide removal are between about 15 min and about 30 min at 300° C., or about 90 min at 200° C. According to an embodiment of the invention, the first substrate temperature can be between about 20° C. and about 400° C., or between about 200° C. and about 400° C., or between about 300° C. and about 400° C.

Further, the $F_2$ process can be monitored to determine an endpoint of this process. Such monitoring can be indirect monitoring based on known etch rate and initial oxide thickness. Alternatively, the processing chamber and/or substrate can be directly monitored to determine an end point for step 204. Direct monitoring may, for example, include detecting an oxygen and/or $F_2$ signal by mass spectroscopy. Specifically, the oxygen signal from oxide removal should taper when the oxide is almost removed, which can be used to decide an endpoint of the $F_2$ process. The precise amount of oxygen and/or $F_2$ to determine endpoint may be determined by Design of Experiment (DOE). However, if the substrate has other areas of thick oxides, then the oxygen signal due to the thin oxide being removed may be "masked" or buried by the signal of the thick oxide. In one embodiment, Step 204 is performed until the amount of oxide remaining on the substrate is small enough that further removal using $F_2$ can damage the substrate.

According to an embodiment of the invention, the processing conditions for the first oxide removal step 204 can include a gas pressure between about 0.1 Torr and about 100 Torr in the process chamber. Alternatively, the gas pressure can be between about 1 Torr and about 10 Torr in the process chamber. The etching gas for the oxide removal step contains $F_2$ gas and can further contain an inert gas. The inert gas can, for example, contain $N_2$, argon (Ar), helium (He), neon (Ne), krypton (Kr), or xenon (Xe), or a combination of two or more thereof. According to one embodiment of the invention, the etching gas contains $F_2$ gas, an inert gas, and a reducing gas. The reducing gas can, for example, contain $H_2$, H, or $NH_3$, or other hydrogen-containing gases. The reducing gas can aid in the decomposition of $F_2$ on the substrate at low substrate temperature. According to an embodiment of the invention, the reducing gas can be plasma-excited in a remote plasma source. A gas flow rate between about 0.010 standard liters per minute (slm) and about 20 slm can be used for the etching gas. As those skilled in the art will readily appreciate, the inert gas can be used to control the concentration of $F_2$ in the first etching gas.

In one example, the $F_2$ etchant gas is diluted to 20% $F_2$ and 80% $N_2$ from a gas source. However, the mixture may be diluted to provide from 3-20% $F_2$, with the remaining gas $N_2$. Exemplary compositions and flows of the etching gas include 8.8 slm $N_2$ and 0.2 slm $F_2$ (8 slm $N_2$ +1 slm of 20% $F_2$ in $N_2$), and 8.6 slm $N_2$ and 0.4 slm $F_2$ (7 slm $N_2$+2 slm of 20% $F_2$ in $N_2$), but embodiments of the invention are not limited to those compositions and gas flows.

Following partial removal of the oxide layer from the substrate in step 204, the flow of the first etching gas is stopped and next, in step 206, the substrate is heated during time period $t_3$ from the first substrate temperature $T_1$ to a second substrate temperature $T_2$ greater than the first substrate temperature $T_1$. The process chamber is evacuated of the first etching gas and/or purged prior to or during the time period $t_3$ to minimize etch damage to the substrate. Time period $t_3$ is a transition step and may be variable in length depending on system design and processing temperature differences between the first oxide removal step 204 at substrate temperature $T_1$ and the substrate temperature $T_2$. The time period $t_3$ can, for example, be between about 5 min and about 45 min, but this is not required in embodiments of the invention. According to an embodiment of the invention, the second substrate temperature $T_2$ can be between about 200° C. and less than 900° C. According to another embodiment of the invention, the second substrate temperature $T_2$ can be between about 700° C. and less than 900° C. According to yet another embodiment of the invention, the second substrate temperature $T_2$ can be between about 850° C. and less than 900° C. Finally, as noted above, in some instances the temperature $T_2$ may be equal to or above 900° C., for example 900° C.-1100° C., where the substrate's exposure to this temperature is less than 15 min., more preferably less than 5 min. for example.

In step 208, during time period $t_4$, the substrate is exposed to a flow of a second etching gas containing $H_2$ gas at the second substrate temperature $T_2$ to further remove the oxide layer from the substrate. As with the first substrate temperature $T_1$, the second substrate temperature $T_2$ can be selected in consideration of the overall thermal budget and/or to allow efficient further removal of the oxide layer from the substrate while minimizing damage such as etching of the substrate material or other materials formed on the substrate material. For example, where a thermal budget allows for higher temperatures and substrate etching is of little concern, then $T_2$ may approach 900° C. However, with lower thermal budgets or when substrate damage is a concern, the substrate temperature $T_2$ can be lower, although the etch rate may also be lowered. Exemplary run times for the oxide removal in step 208 are between about 15 min and about 30 min at substrate temperatures between about 800° C. and about 850° C.

According to an embodiment of the invention, the processing conditions for the second oxide removal step 206 can include a gas pressure between about 0.1 Torr and about 100 Torr in the process chamber. Alternatively, the gas pressure can be between about 1 Torr and about 10 Torr, for example 5 Torr, in the process chamber. The second etching gas may consist of undiluted $H_2$ or, alternately, $H_2$ may be diluted with an inert gas from a gas source. The inert gas can, for example, contain $N_2$, argon (Ar), helium (He), neon (Ne), krypton (Kr), or xenon (Xe), or a combination of two or more thereof. A gas flow rate between about 0.010 standard liters per minute (slm) and about 20 slm, for example about 4.5 slm can be used for the second etching gas. As those skilled in the art will readily appreciate, the inert gas can be used to control the concentration of $H_2$ in the second etching gas.

Following removal of the oxide layer from the substrate in step 208, the substrate may be further processed to form a semiconductor device. According to one embodiment of the invention, a film may be formed on the substrate following the oxide layer removal step 208, where the substrate temperature is first adjusted during time period $t_5$ from the second substrate temperature $T_2$ to a third substrate temperature $T_3$ lower than the second substrate temperature $T_2$. Time period $t_5$ is a transition step and may be variable in length depending on system design and processing temperature differences between the oxide removal step 208 at substrate temperature $T_2$ and the substrate temperature $T_3$. The time period $t_3$ can, for example, be between about 5 min and about 45 min, but this is not required in embodiments of the invention. According to one embodiment of the invention, when depositing a Si-containing film on the substrate, the third substrate temperature $T_3$ can be between about 650° C. and about 750° C. According to another embodiment of the invention, the third substrate temperature $T_3$ can be between about 750° C. and about 850° C.

The film may be formed on the substrate following the removal of the oxide layer in step 208 without exposing the substrate to ambient air that can form a new oxide layer on the substrate. The film can be a Si-containing film that is formed on the substrate by exposing the substrate to a gas containing a Si-containing gas, for example, $SiH_4$, $SiCl_4$, $Si_2H_6$, $SiH_2Cl_2$, or $Si_2Cl_6$, or a combination of two or more thereof. According to an embodiment of the invention, the Si-containing gas can further contain a germanium-containing gas, including, for example, $GeH_4$, $GeCl_4$, or a combination thereof, for depositing a SiGe film on the substrate. Alternately, the film may be a Ge film deposited from a germanium-containing gas. The deposited film can, for example, be an epitaxial Si film where the crystal lattice of a crystalline Si substrate is extended through growth of a new Si film. Alternatively, the deposited film can be a poly-Si film or an amorphous Si film. Or, the deposited film can be SiGe film. In yet another example, the film may be a strained Si film deposited onto a SiGe film.

As described above, the Si-containing film can be formed by providing a Si-containing gas from a non-plasma gas source such as the gas source 94 in FIG. 1. Alternatively, a Si-containing gas from the second gas source 96 may be excited by the plasma source 95 to assist in the deposition of a Si-containing film on the substrate. Time period $t_6$ is a film forming step and generally depends on the desired film thickness. For many applications with film thickness less than about 500 angstrom, the time period $t_6$ can be less than about one hour.

According to another embodiment of the invention, the film can be a high-k film, for example $Ta_2O_5$, $TiO_2$, $Al_2O_3$, $Y_2O_3$, $HfSiO_x$, $HfO_2$, $HfSiO_xN_y$, $ZrO_2$, $ZrSiO_x$, $TaSiO_x$, $ZrSiO_xN_y$, $SrO_x$, $SrSiO_x$, $LaO_x$, $LaSiO_x$, $YO_x$, or $YSiO_x$. For depositing high-k films, the third substrate temperature $T_3$ can be between about 200° C. and about 600° C. According to yet another embodiment of the invention, the third substrate temperature $T_3$ can be between about 400° C. and about 500° C.

When a film with a desired thickness has been formed on the substrate, flow of the deposition gas is stopped, the substrate is allowed to cool down during time period $t_7$, and the substrate may subsequently be removed from the process chamber or further processed in the process chamber. Like time periods $t_1$, $t_3$, and $t_5$, the time period $t_7$ is a transition step and may be variable in length. Time period $t_7$ can, for example, be between about 2 min and about 15 min, but this is not required in embodiments of the invention.

Although not shown in FIG. 2A, purging steps may be performed in between the steps of the process 200. For example, the process chamber may be purged during time periods $t_1$, $t_3$, $t_5$, $t_7$ to keep the substrate surface clean. The purge gas can, for example, contain $H_2$, an inert gas such as $N_2$, or a noble gas. Furthermore, one or more of the purge steps may be replaced or complemented with pump down steps where no purge gas is flowed.

As would be appreciated by those skilled in the art, each of the steps or stages in the flowchart of FIG. 2A may encompass one or more separate steps and/or operations. Accordingly, the recitation of only four steps in 202, 204, 206, and 208 should not be understood as limiting the method of the present invention solely to four steps or stages. Moreover, each representative step or stage 202, 204, 206, and 208 should not be understood as being limited to a single process.

Figure 3A:
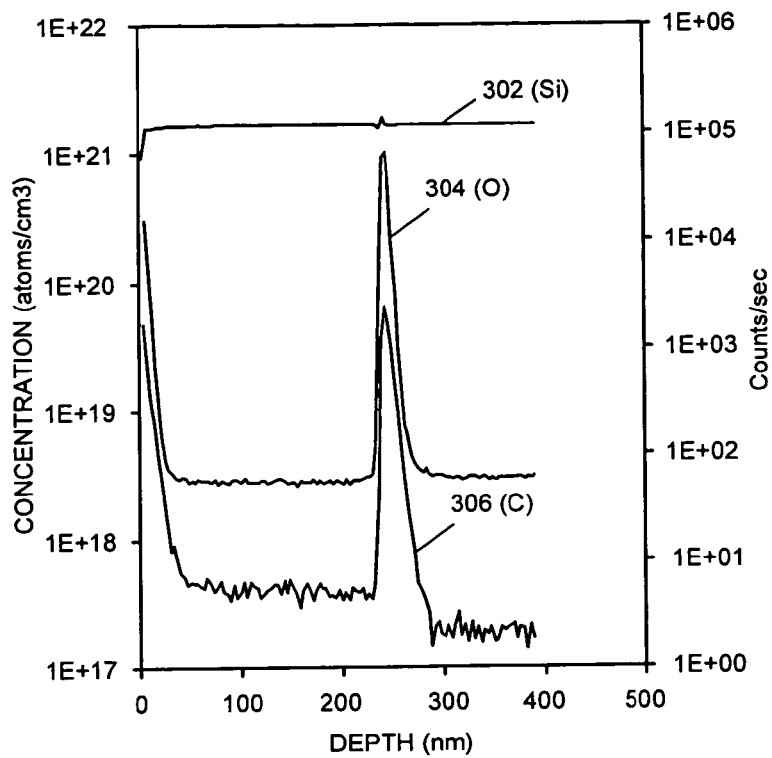
FIGS. 3A-3C illustrate Secondary Ion Mass Spectroscopy (SIMS) depth profiles of Si films deposited onto Si substrates with and without oxide removal according to an embodiment of the invention.
Figure 3B:
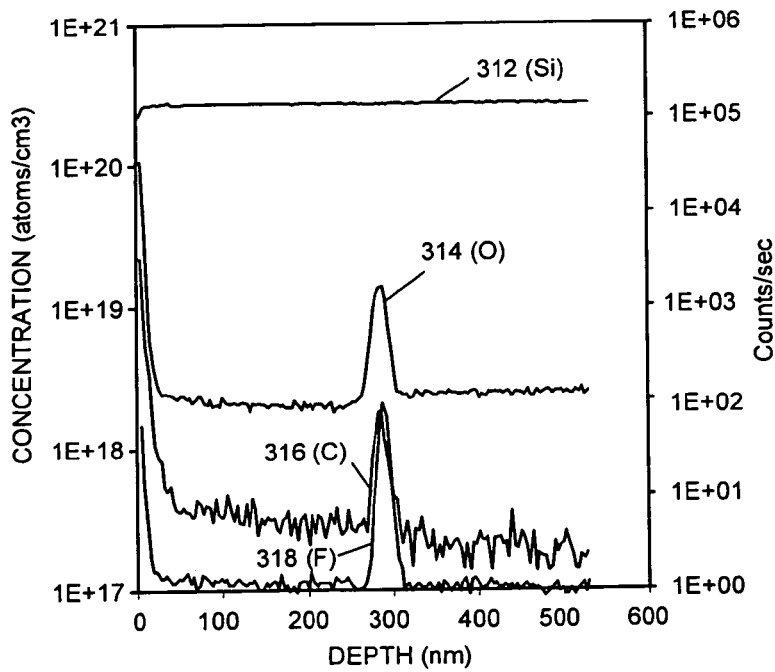
Figure 3C:
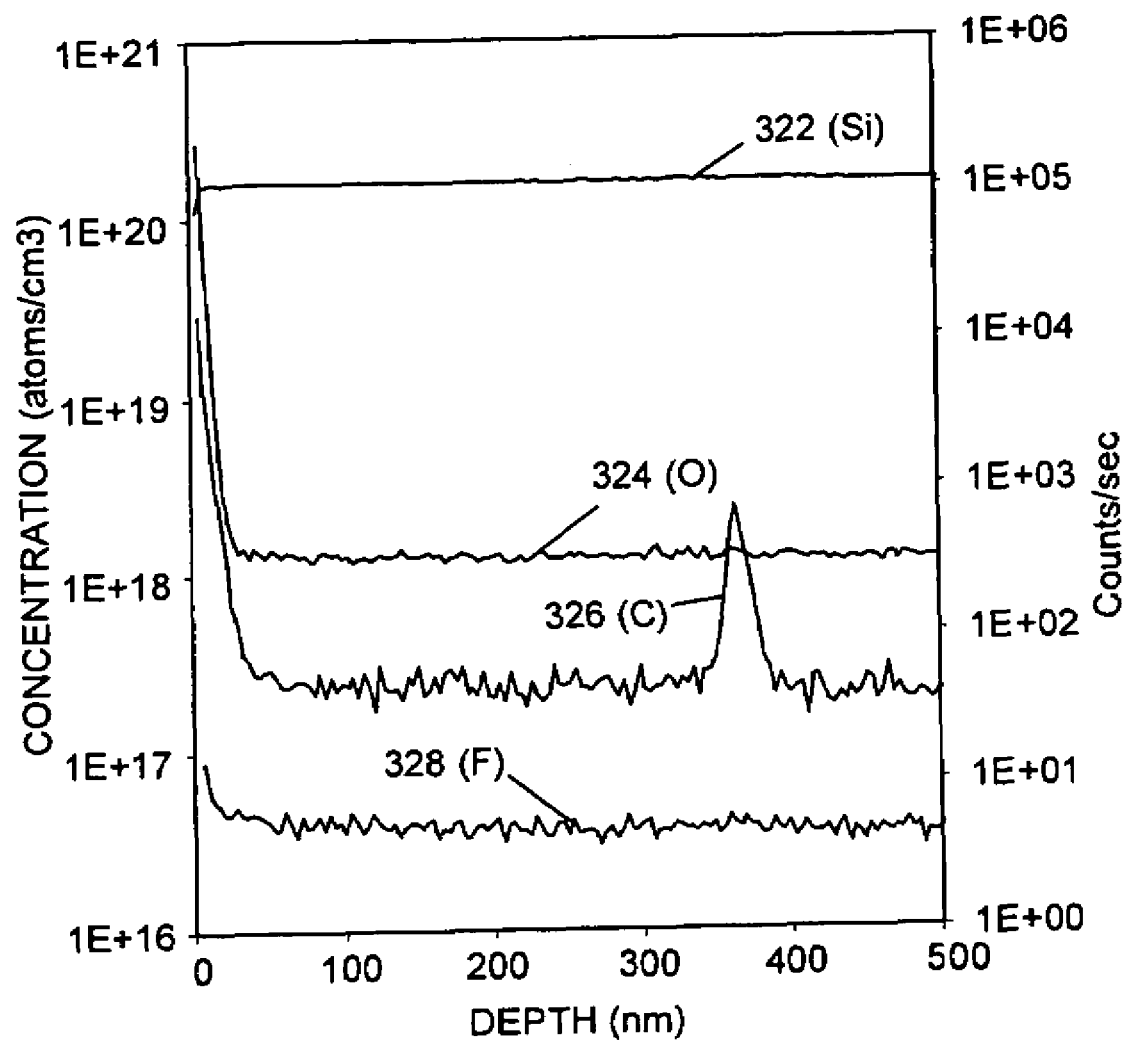

FIGS. 3A-3C illustrate SIMS depth profiles of poly-Si films deposited onto Si substrates with and without oxide removal according to an embodiment of the invention. Comparison of the depth profiles for the differently prepared substrates allows for evaluating oxide removal steps, since the poly-Si films prevent further oxidation of the interface between the Si substrate and the poly-Si films following the poly-Si film deposition. The as-received Si substrates were first cleaned ex-situ (outside the process chamber) using standard HF wet cleaning and thereafter the Si substrates were transferred to the process chamber for oxide removal and poly-Si deposition.

FIG. 3A illustrates SIMS depth profile of a poly-Si film deposited onto a HF-cleaned substrate, where silicon (Si) signal 302, oxygen (O) signal 304, and carbon (C) signal 306-were monitored. The O signal 304 corresponds to an O surface coverage of about $9.6 \times 10^{14}$ atoms/cm$^2$ or a $SiO_2$ layer with a thickness of about 2 angstrom or about one monolayer of oxide. This demonstrates the sensitivity of SIMS depth profiling. The thickness of a native oxide layer on as-received (before $H_2O$:HF cleaning) Si substrates is commonly between about 10-15 angstrom and the thin oxide layer (about 2 angstrom thick) shown in FIG. 3A was formed during transfer of the $H_2O$:HF cleaned Si substrate in air to the process chamber.

FIG. 3B shows a SIMS depth profile of a poly-Si film deposited onto a substrate that was $H_2O$:HF cleaned and further cleaned in the process chamber. A native oxide layer was partially removed from the Si substrate in-situ using an etching gas containing $F_2$ prior to deposition of the poly-Si film. The etching gas contained 8 slm $N_2$+1 slm of 20% $F_2$ in $N_2$, the substrate temperature was 300° C., the process chamber pressure was 1 Torr, and the oxide removal process was carried out for 30 min. Si signal 312, O signal 314, C signal 316, and F signal 318 signals were monitored in FIG. 3B and the O signal 314 corresponds to an O surface coverage of about $0.24 \times 10^{14}$ atoms/cm$^2$ or an $SiO_2$ layer with a thickness of about 0.05 angstrom. It is contemplated that the O surface coverage (and thus the average $SiO_2$ thickness) can be further reduced by utilizing a higher purity etching gas.

Comparison of the depth profiles shown in FIGS. 3A and 3B demonstrates that the use of an etching gas containing $F_2$ results in effective partial removal of an oxide layer at a low substrate temperature but F-containing impurities can be left on the substrate surface following the $F_2$ exposure as illustrated by the F signal 318.

FIG. 3C shows a SIMS depth profile of a poly-Si film deposited onto a substrate that was $H_2O$:HF cleaned and further cleaned in the process chamber according to embodiments of the invention. First, a native oxide layer was partially removed from the Si substrate using a first etching gas containing $F_2$. The first etching gas contained 8 slm $N_2$+1 slm of 20% $F_2$ in $N_2$, the substrate temperature was 300° C., the process chamber pressure was 1 Torr, and the oxide removal process was carried out for 15 min. Next, the native oxide layer was further removed from the Si substrate using a second etching gas containing $H_2$, the substrate temperature was 850° C., and the oxide removal process was carried out for 15 min. The Si signal 322, O signal 324, C signal 326, and F signal 328 in FIG. 3C show that any remaining native oxide and F-containing impurities from the exposure to the first etching gas were fully removed by the second etching gas. It is believed that the C signal 326 originates from exposure to organic material in air during transfer of the substrate from the $H_2O$:HF bath to the process chamber. The C signal 326 may be used to indicate the location of the interface between the poly-Si film and the substrate.

Figure 4A:
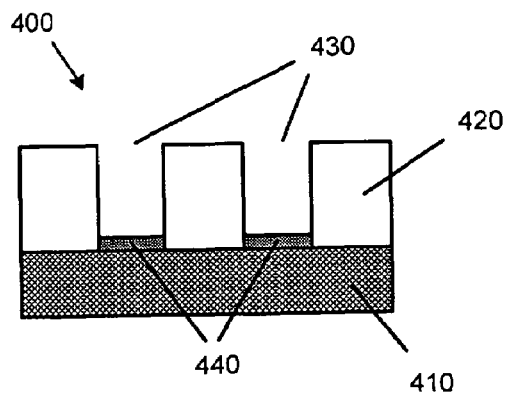
FIGS. 4A-4D schematically illustrate oxide removal from a patterned structure and subsequent deposition of a film onto the patterned structure according to an embodiment of the invention.

FIGS. 4A-4D schematically illustrate oxide removal from a patterned structure and subsequent deposition of a Si-containing film onto the patterned structure according to an embodiment of the invention. FIG. 4A illustrates a patterned structure 400 containing a substrate 410, a patterned film 420, and oxide layers 440 formed on the substrate 410 in the openings 430. Although not shown in FIG. 4A, the patterned film 420 may also contain an oxide layer. The patterned film 420 can, for example, be a dielectric film such as a $SiO_2$ film, a SiON film, a low-k film, or a high-k film. The openings 430 can, for example, be vias or trenches, or combinations thereof. The patterned structure 400 is an exemplary structure used in the device manufacturing and can contain a Si substrate 410 and an overlying photolithographically patterned film 420.

Figure 4B:
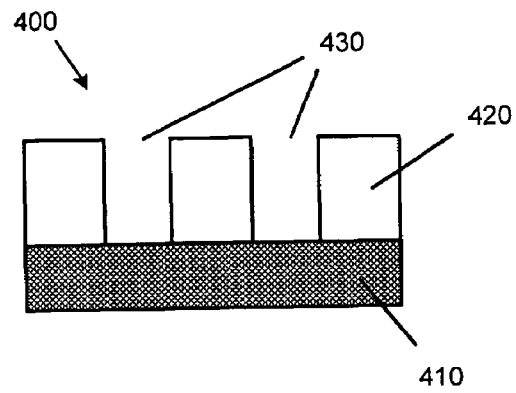

FIG. 4B illustrates the patterned structure 400 following removal of the oxide layers 440 from the openings 430 according to embodiments of the invention as described above.

Figure 4C:
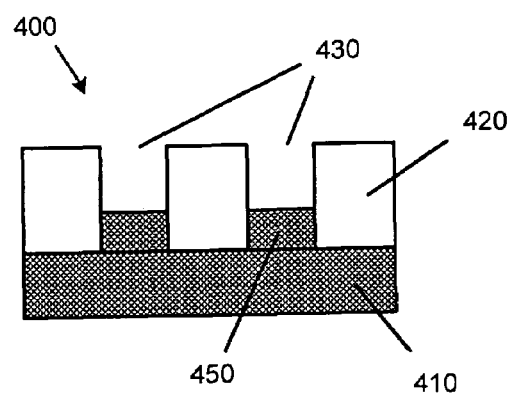

FIG. 4C illustrates the patterned structure 400 following selective deposition of a film 450 onto the exposed portion of the substrate 410 according to embodiments of the invention. The selectively deposited film 450 can, for example, be an epitaxial Si film deposited on a crystalline Si substrate 410. The epitaxial Si film 450 can, for example, be selectively deposited on the exposed portion of the Si substrate 410, using, for example, a gas containing $Si_2Cl_6$ (HCD), a substrate temperature of between about 750° C. and about 850° C., for example at about 800° C. Further details of utilizing HCD gas to deposit Si-containing films are described in U.S. patent application Ser. No. 10/673,375, titled "DEPOSITION OF SI-CONTAINING FILMS FROM HEXACHLORODISILANE."

The selective deposition of the epitaxial Si-containing film 450 allows for subsequent removal of the patterned film 420 from-the Si substrate 410 using methods known to those skilled in the art, to form a raised epitaxial Si-containing film 450 on the Si substrate 410. In general, the patterned film 420 can include an oxide mask (e.g., $SiO_2$) and a nitride mask (e.g., $Si_3N_4$). The use of selective deposition of epitaxial Si-containing films can be used for manufacturing silicon-on-insulator (SOI) devices with raised source and drain regions. During SOI device fabrication, processing may consume an entire Si film in source and drain regions, thereby requiring extra Si in these regions that can be provided by selective epitaxial growth (SEG) of Si-containing films. Selective epitaxial deposition of Si-containing films can reduce the number of photolithography and etch steps that are needed, which can reduce the overall cost and complexity involved in manufacturing a device.

Figure 4D:
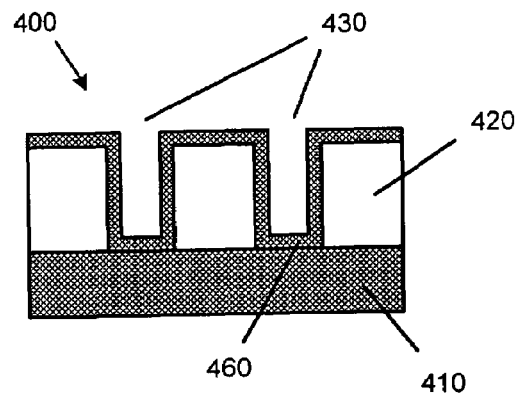

FIG. 4D illustrates the patterned structure 400 following non-selective (blanket) deposition of a film 460 onto the patterned structure 400 according to an embodiment of the invention. According to one embodiment of the invention, the film 460 can be a Si film. The Si film 460 can be deposited on the patterned structure 400 with substantially uniform thickness, regardless of the type of materials comprising the substrate 410 and the patterned film 420. In one example, a Si film 460 can be formed on the patterned structure 400 using a process, gas containing $Si_2Cl_6$, a substrate temperature between about 550° C. and about 750° C. In another example, a process gas containing $Si_2Cl_6$ and $SiH_4$ may be used. As would be appreciated by those skilled in the art, the crystal structure of the deposited Si films can be a function of processing conditions, including substrate temperature, process pressure, and gas composition.

Although only certain embodiments of this invention have been described in detail above, those skilled in the art will readily appreciate that many modifications are possible in the exemplary embodiment without materially departing from the novel teachings and advantages of this invention. Accordingly, all such modifications are intended to be included within the scope of this invention.

What is claimed is:

1. A method for processing a substrate, comprising:
   providing the substrate in a process chamber, the substrate having an oxide layer formed thereon; and
   performing a sequential oxide removal process, comprising:
      exposing the substrate at a first substrate temperature that is less than or equal to 400° C. to a flow of a first etching gas comprising $F_2$ to partially remove the oxide layer from the substrate,
      raising the temperature of the substrate from the first substrate temperature to a second substrate temperature that is less than 900° C., and
      exposing the substrate at the second temperature to a flow of a second etching gas comprising $H_2$ to further remove the oxide layer and any F-containing impurities remaining on the substrate in a hydrogen anneal,
   wherein the flow of the first etching gas comprising $F_2$, in addition to partially removing the oxide layer from the substrate, modifies the remaining oxide layer, thereby facilitating the further removal of the remaining oxide layer by the second etching gas comprising $H_2$, and not $F_2$.

2. The method according to claim 1, wherein the first substrate temperature is between about 20° C. and about 400° C.

3. The method according to claim 2, wherein the first substrate temperature is between about 200° C. and about 400° C.

4. The method according to claim 1, wherein the second substrate temperature is at least about 200° C. and less than 900° C.

5. The method according to claim 4, wherein the second substrate temperature is at least about 800° C. and less than 900° C.

6. The method according to claim 1, wherein the first substrate temperature is between about 200° C. and about 400° C. and the second substrate temperature is at least about 800° C. and less than 900° C.

7. The method according to claim 1, wherein the first etching gas comprises $F_2$ and an inert gas containing $N_2$, Ar, He, Ne, Kr, or Xe, or a combination of two or more thereof.

8. The method according to claim 7, wherein said first etching gas comprises approximately 3%-20% $F_2$ with a remainder of the etching gas being $N_2$.

9. The method according to claim 1, where the first etching gas comprises $F_2$ and a reducing gas containing $H_2$, H, or $NH_3$.

10. The method according to claim 1, wherein the exposing steps are performed at a process chamber pressure between about 0.1 Torr and about 100 Torr.

11. The method according to claim 1, further comprising:
   forming a film on the substrate following the sequential oxide removal process.

12. The method according to claim 11, wherein the sequential oxide removal process and the forming are performed in the same process chamber without exposing the substrate to ambient air.

13. The method according to claim 11, wherein the forming comprises exposing the substrate to a Si-containing gas to deposit a Si-containing film.

14. The method according to claim 13, wherein the Si-containing film comprises poly-Si, amorphous Si, epitaxial Si, or SiGe.

15. The method according to claim 13, wherein the Si-containing gas comprises $SiH_4$, $SiCl_4$, $Si_2H_6$, $SiH_2Cl_2$, or $Si_2Cl_6$, or a combination of two or more thereof.

16. The method according to claim 11, wherein the forming comprises exposing the substrate to a Si-containing gas containing (1) $SiH_4$, $SiCl_4$, $Si_2H_6$, $SiH_2Cl_2$, or $Si_2Cl_6$, or a combination of two or more thereof, and (2) a germanium-containing gas containing $GeH_4$ or $GeCl_4$, or a combination thereof.

17. The method according to claim 11, wherein the film comprises a Ge film or a high-k film.

18. The method according to claim 17, wherein the film comprises a high-k film comprising $Ta_2O_5$, $TiO_2$, $Al_2O_3$, $Y_2O_3$, $HfSiO_x$, $HfO_2$, $HfSiO_xN_y$, $ZrO_2$, $ZrSiO_x$, $TaSiO_x$, $ZrSiO_xN_y$, $SrO_x$, $SrSiO_x$, $LaO_x$, $LaSiO_x$, $YO_x$, or $YSiO_x$, or combinations of two or more thereof.

19. The method according to claim 11, wherein the film is selectively formed on a Si-containing surface of the substrate.

20. The method according to claim 11, wherein the film is a strained Si film formed on a SiGe substrate.

21. A method for processing a Si substrate, comprising:
   providing the Si substrate in a process chamber, the Si substrate having an oxide layer formed thereon;
   performing a sequential oxide removal process, comprising:
      exposing the Si substrate to a flow of a first etching gas comprising $F_2$ at a first substrate temperature between about 20° C. and about 400° C. to partially remove the oxide layer from the Si substrate,
      raising the temperature of the substrate from the first substrate temperature to a second substrate temperature lower than 900° C., and
      exposing the substrate at the second substrate temperature to a flow of a second etching gas comprising $H_2$ to further remove the oxide layer and any F-containing impurities remaining on the substrate in a hydrogen anneal; and forming an epitaxial Si film on the Si substrate following the sequential oxide removal process, wherein the flow of the first etching gas comprising $F_2$, in addition to partially removing the oxide layer from the substrate, modifies the remaining oxide layer, thereby facilitating the further removal of the remaining oxide layer by the second etching gas comprising $H_2$, and not $F_2$.

22. The method of claim 21, further comprising performing a $H_2O$:HF cleaning of the substrate prior to said providing step.

23. The method of claim 22, wherein the first etching gas contains 8 slm $N_2$+1 slm of 20% $F_2$ in $N_2$ at a process chamber pressure of about 1 Torr, and the first substrate temperature is about 300° C.

24. The method of claim 23, wherein the second substrate temperature is about 850° C.

* * * * *